United States Patent
Huang et al.

(10) Patent No.: US 6,710,381 B1
(45) Date of Patent: Mar. 23, 2004

(54) MEMORY DEVICE STRUCTURE WITH COMPOSITE BURIED AND RAISED BIT LINE

(75) Inventors: Weng-Hsing Huang, Hsinchu (TW); Kent Kuohua Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/065,355

(22) Filed: Oct. 8, 2002

(51) Int. Cl.[7] .............................................. H01L 29/749
(52) U.S. Cl. ........................................ 257/217; 257/27
(58) Field of Search ........................ 257/27, 306, 216, 257/217; 365/200; 438/257

(56) References Cited

U.S. PATENT DOCUMENTS

| | | | |
|---|---|---|---|
| 5,796,136 A | * | 8/1998 | Shinkawata ................ 257/306 |
| 6,232,181 B1 | * | 5/2001 | Lee ............................ 438/257 |
| 2002/0126548 A1 | * | 9/2002 | Ciavatti ...................... 365/200 |

* cited by examiner

Primary Examiner—David Nelms
Assistant Examiner—Thinh T Nguyen
(74) Attorney, Agent, or Firm—Jiang Chyun IP Office

(57) ABSTRACT

The present invention provides a memory structure, comprising: a substrate; a gate oxide layer disposed on a portion of the substrate; a gate structure disposed on the gate oxide layer; a buried bit line disposed in the substrate along both sides of the gate structures; a raised line disposed on the burled bit line; an isolating spacer disposed on both sidewalls of the gate structure and a word line disposed over the substrate in a direction perpendicular to the buried bit line; and an insulation layer disposed on a top of the raised line to electrically isolate the raised line and the word line.

6 Claims, 3 Drawing Sheets

MEMORY DEVICE STRUCTURE WITH COMPOSITE BURIED AND RAISED BIT LINE

BACKGROUND OF INVENTION

1. Field of Invention

The present invention relates to a memory device structure and a method for manufacturing the same. More particularly, the present invention relates to a memory structure and a method for manufacturing the same, which can improve reliability by using the raised bit line.

2. Description of Related Art

Memory is widely applied In the integrated circuit industry and plays an especially essential role in the electronic industry. For the storage of digital data, the capacitance of the memory is called a "bit" and the unit for data storage in a memory is called a "memory cell". The memory cells are arranged in an array, consisting of columns and rows. Between a set of columns and rows, the specific position of each memory cell is an address. A common wiring line, which is called a word line, couples memory cells in the same column or the same row. Another wiring line vertical to the common wiring line is called a bit line.

FIG. 1 illustrates a cross-sectional view of a prior art memory structure. Referring to FIG. 1, a gate oxide layer 102 is formed on a substrate 100. Next, a buried bit line 104 is formed in the substrate 100. A field oxide insulation layer 106 is formed on the buried bit line 104 to Isolate the buried bit line and a subsequent word line. Afterwards, a word line 108 is formed on the field insulation layer 106 and the gate oxide layer 102, in a direction perpendicular to the buried bit line 104.

As the demand for high-density memory increases, the width of the buried bit-lines in memory becomes smaller to satisfy the demand. The smaller the width of the bit line, the higher the resistance, thus reducing the current of the memory cell and inducing higher bit-line loading. However, if the junction depth of the bit line is Increased to improve the aforementioned problems, new issues, including short channel effects and junction leakage, can arise. On the other hand, if heavy dosage implantation is used to reduce the resistance, solid solubility limitation may hamper application of heavy dosage implantation for forming shallow junction for the bit lines. Moreover, in the prior memory device structure, at least one bit line contact is arranged for every 32 or 64 bit lines to control the memory device, which restrains further Improvements toward higher integration. Therefore, it is significant to decrease the number of the bit line contacts for increasing Integration of the device.

SUMMARY OF INVENTION

Accordingly, the present invention provides a memory structure and a method for manufacturing the memory structure, which can reduce the resistance of bit lines.

Accordingly, the present invention provides a memory structure and a method for manufacturing the memory structure, which can allow shallow junctions for buried bit lines, thus preventing short channel effects and junction leakage.

Accordingly, the memory structure and the method for manufacturing the memory device structure of the present invention can decrease the number of the bit line contact in the device, thus increasing device Integration.

As embodied and broadly described herein, the invention provides a memory structure, comprising: a substrate; a gate oxide layer disposed on a portion of the substrate; a gate disposed on the gate oxide layer; a buried bit line disposed in the substrate along both sides of the gate; a raised line disposed on the buried bit line; a spacer disposed on both sidewalls of the gate structure, thus isolating the gate and the raised line; a word line disposed on the gate in a direction perpendicular to the buried bit line; and an insulation layer disposed on a top of the raised line to electrically isolate the word line and the raised line. The bit line of the present invention consists of the raised line and the underlying buried bit line.

As embodied and broadly described herein, the invention provides a method for manufacturing a memory structure, comprising; forming a thin oxide layer, a first conductive layer and a material layer on the substrate sequentially; patterning the first conductive layer and the material layer to form the bar-shaped conductive structure and the cap layer; forming a buried bit line in the substrate along both sides of the bar-shaped conductive structure by using the cap layer as a mask; removing the thin oxide layer that is not covered by the bar-shaped conductive structure, so that the remained thin oxide layer underneath the bar-shaped conductive structure is the gate oxide layer; forming a spacer on sidewalls of the bar-shaped conductive structure with a first etching selectivity between the cap layer and the spacer; forming a raised line on the buried bit line, while the spacer isolates the bar-shaped conductive structure and the raised line; forming an insulation layer on the raised line to electrically isolate a subsequent word line and the raised line, with a second etching selectivity between the cap layer and the insulation layer; removing the cap layer; and forming a second conductive layer over the substrate to cover the bar-shaped conductive structure; and forming the word line and a plurality of gates over the substrate by patterning the second conductive layer and the bar-shaped conductive structure in a direction perpendicular to the buried bit line. The word line is electrically connected to the gates on the same row.

It Is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the Invention and, together with the description, serve to explain the principles of the invention. In the drawings.

DETAILED DESCRIPTION

FIGS. 2A to 2G illustrates cross-sectional views of the process steps for forming a memory device structure according to one preferred embodiment of this invention.

Figure 1:
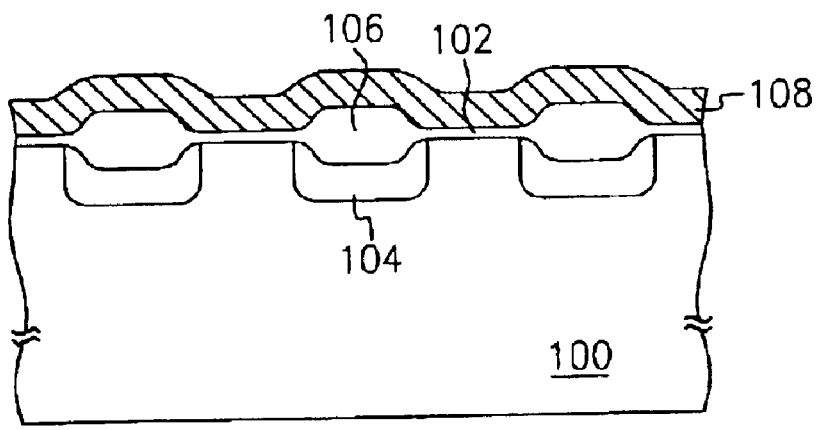
FIG. 1 illustrates a cross-sectional view of a prior art memory structure.
Figure 2A:
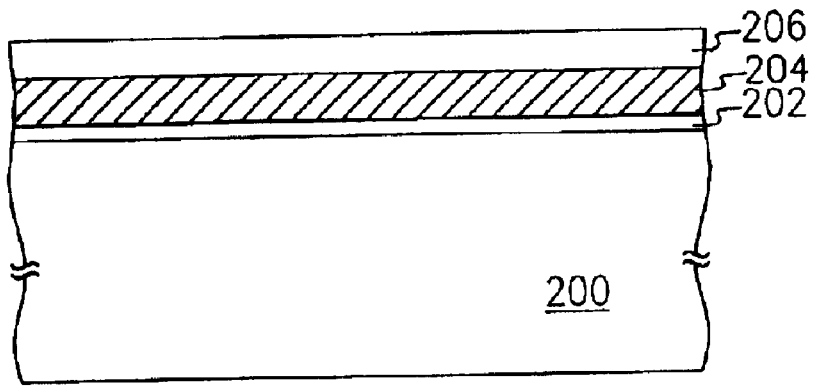
FIGS. 2A to 2G illustrates cross-sectional views of the process steps for forming a memory device structure according to one preferred embodiment of this invention.

Referring to FIG. 2A, a thin oxide layer 202 is formed on a provided substrate 200. The thin oxide layer 202 is formed by, for example, a thermal oxidation process. Next, a conductive layer 204 and a material layer 206 are sequentially formed on the thin oxide layer 202. The material for forming the gate conductive layer 204 includes polysilicon, for example. The material layer 206 Is, for example, a silicon nitride layer.

Figure 2B:
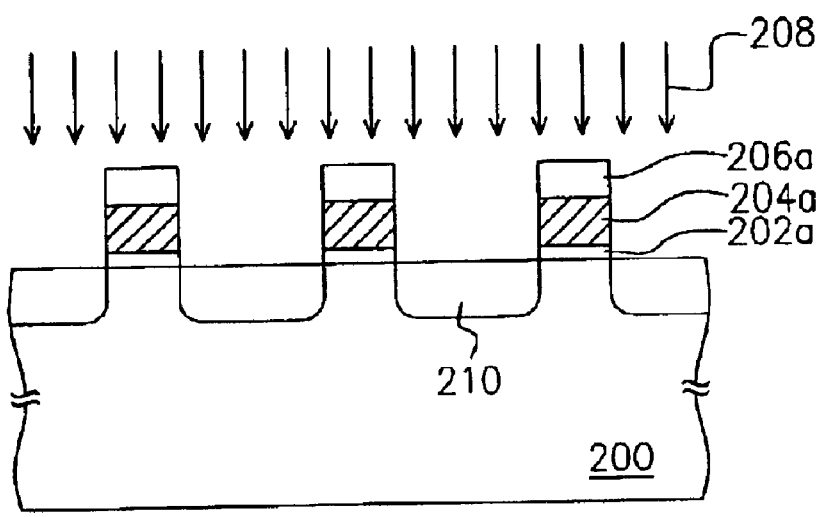

Referring to FIG. 2B, the conductive layer 204 and the material layer 206 are patterned to form a bar-shaped conductive structure 204a and a cap layer 206a on the conductive structure 204a. Afterwards, an Ion Implantation step 208 is performed using the cap layer 206a and the conductive structure 204a as a mask, so that a buried bit line 210 is formed in the substrate 200 on both sides of the bar-shaped conductive structure 204a. Next, the thin oxide layer 202 that is not covered by the bar-shaped conductive structure 204a is removed to expose the buried bit line 210, while the thin oxide layer underneath the bar-shaped conductive structure 204a is remained as a gate oxide layer 202a.

In the present Invention, the buried bit line 210 is formed after forming the thin oxide layer 202 and the bar-shaped conductive structure 204a, so that diffusion resulting from high temperature during the processes of forming the thin oxide layer 202 and the bar-shaped conductive structure 204a can be decreased.

Figure 2C:
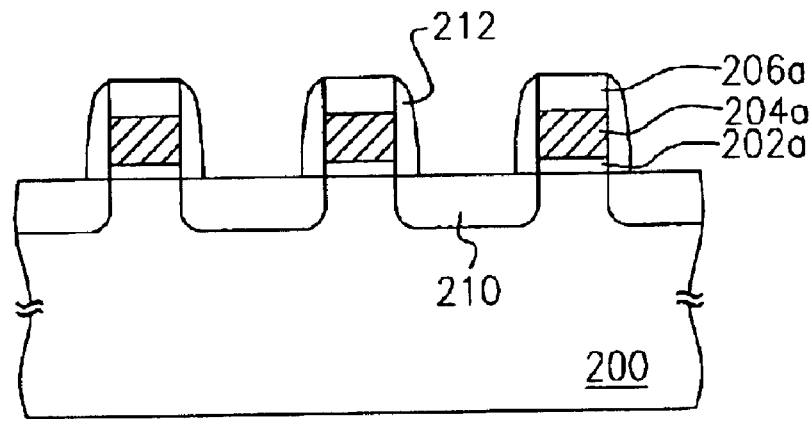

Referring to FIG. 2C, spacers 212 are then formed on sidewalls of the cap layer 206a and the conductive structure 204a. There is an etching selectivity between the cap layer 206a and the spacers 212. The method for forming spacers 210 includes, for example, depositing a conformal oxide layer (not shown) and then etching back the oxide layer to form spacers.

Figure 2D:
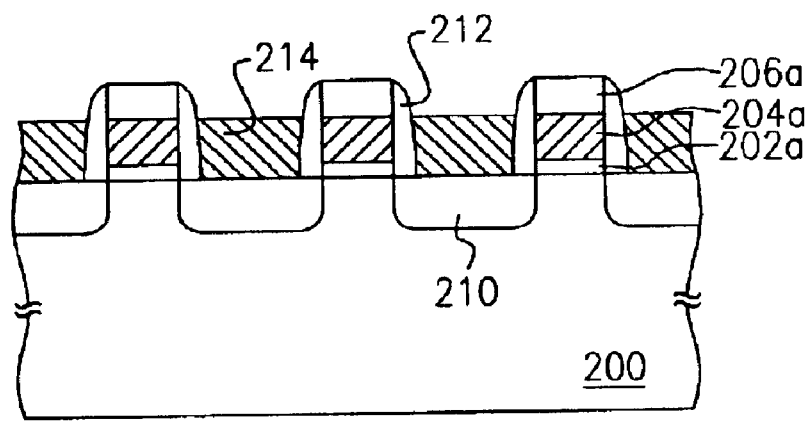

Referring to FIG. 2D, a raised line 214 is formed on the buried bit line 210. The raised line 214 is electrically isolated from the bar-shaped conductive structure 204a by the spacers 212. For example, the raised line 214 is made of polysilicon. The method for forming the raised line 214 includes, for example, forming a first conductive layer (not shown) over the substrate 200 covering the buried bit lines 210 and then etching back the first conductive layer to expose the cap layer 206a and a portion of the spacers 212. The remained first conductive layer is the raised line 214.

In the present Invention, the memory device has a bit line consisting of the buried bit line 210 and the raised line 214, thus reducing the resistance of the bit line even with a shallow junction. Therefore, problems resulting from introducing the shallow junction, such as, short channel effect and junction leakage can be prevented.

Figure 2E:
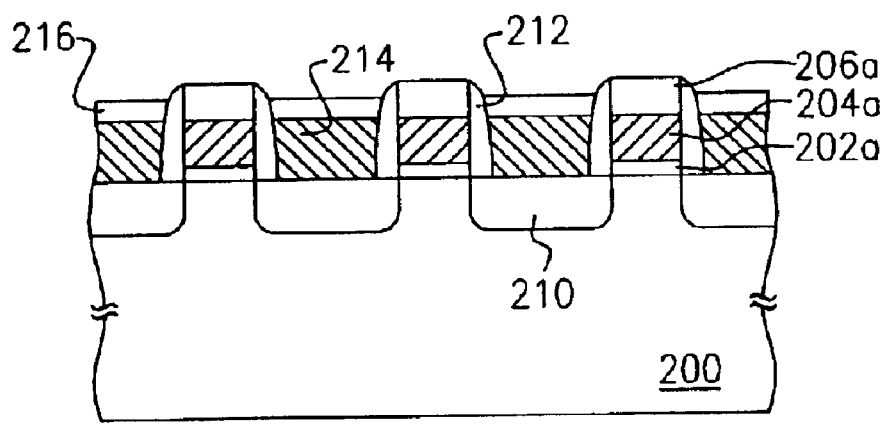

Referring to FIG. 2E, after forming the raised line 214, an insulation layer 216 Is formed over the substrate 200 to cover a surface of the raised line 214, thus electrically isolating the raise line 214 and a subsequent word line. There is an etching selectivity between the cap layer 206a and the insulation layer 216. The insulation layer 216 is made of, for example, silicon oxide formed by thermal oxidation or chemical vapor deposition.

Figure 2F:
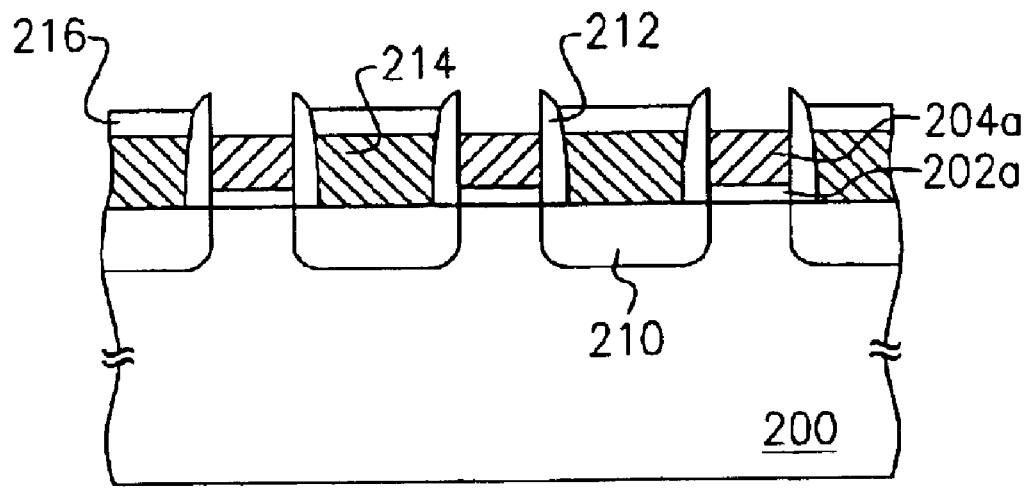

Referring to FIG. 2F, the cap layer 206a is removed to expose the bar-shaped conductive structure 204a. There is an etching selectivity between the cap layer 206a and the spacers 212, and between the cap layer 206a and the insulation layer 216, so that the spacers 212 and the insulation layer 216 are not removed along with the removal of the cap layer 206a.

Figure 2G:
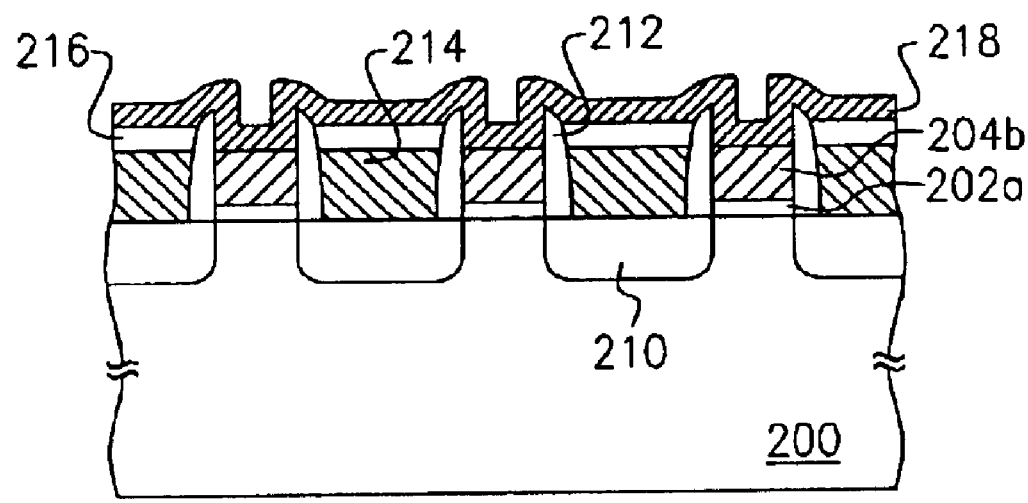

Referring to FIG. 2G, a word line 218 and a plurality of gates 204b are formed, by forming a second conductive layer (a polysilicon layer, not shown) to cover the bar-shaped conductive structure 204a and the Insulation layer 216 and then patterning the second conductive layer and the bar-shaped conductive structure 204a, in a direction perpendicular to the buried bit line 210. The word line 218 is electrically connected to the gates 204b on the same row.

The memory device structure of the present invention comprises a substrate 200, a gate oxide layer 202a, a gate 204b, a burled bit line 210, a spacer 212, a raised line 214, a word line 218 and an insulation layer 216.

A gate oxide layer 202a is disposed on a portion of the substrate 200, while a gate 204b is disposed on the gate oxide layer 202a. A burled bit line 210 is disposed in the substrate along both sides of the gate 204b. Moreover, a raised line 214 is disposed on a surface of the buried bit line 210. Therefore, the bit line of the present invention consists of the raised line 214 and the underlying buried bit line 210. A spacer 212 is disposed on both sidewalls of the gate 204b, thus Isolating the gate 204b and the raised line 214. A word line 218 is disposed on a top surface of the gate 204b in a direction perpendicular to the buried bit line 210 (and the raised line 214), while an insulation layer 216 is disposed on a top surface of the raised line 214 to electrically isolate the word line 218 and the raised line 214.

Because the memory device of the present invention includes the bit line consisting of the buried bit line 210 and the raised line 214, the resistance of the whole bit line can be effectively reduced. Since the design of the bit line employs the raised line to reduce the resistance of the bit line, the buried bit line can adopt shallow junctions, thus avoiding short channel effects and punch-through leakage and increasing reliability. Moreover, the voltage drop of the bit line becomes less as the resistance is reduced, so that the required number of the bit line contact in the device is decreased.

In conclusion, the present Invention provide the following advantages:

1. The present invention provides a memory device structure and a method for manufacturing the memory structure, which can effectively reduce the resistance of bit lines and avoid high bit line loading.

2. The memory structure and the method for manufacturing the memory structure disclosed in the present Invention can allow shallow junctions for burled bit lines, thus preventing short channel effects and punch-through leakage.

3. The memory structure and the method for manufacturing the memory device structure of the present invention can decrease the number of the bit line contact in the device, thus increasing device integration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

We claim:

1. A memory device structure, comprising:

a substrate;

a gate oxide layer disposed on a portion of the substrate;

a gate disposed on the gate oxide layer, wherein the gate and the gate oxide layer form a gate structure;

a buried bit line disposed in the substrate along both sides of the gate;

a raised line disposed on the buried bit line;

a spacer disposed on both sidewalls of the gate structure, thus electrically isolating the gate and the raised line, wherein a top of the raised line is lower than a top of the spacer;

a word line disposed on the gate in a direction perpendicular to the buried bit line; and an insulation layer disposed on the top of the raised line to electrically isolate the word line and the raised line.

2. The structure as claimed in claim 1, wherein a material for forming the insulation layer comprises silicon oxide.

3. The structure as claimed in claim 1, wherein a material for forming the spacer comprises silicon oxide.

4. The structure as claimed in claim 1, wherein a material for forming the raised line comprises polysilicon.

5. The structure as claimed in claim 1, wherein a material for forming the word line comprises polysilicon.

6. The structure as claimed in claim 1, wherein the buried bit line is a shallow junction buried bit line.

* * * * *